United States Patent
Kim et al.

(10) Patent No.: US 6,607,963 B2
(45) Date of Patent: Aug. 19, 2003

(54) METHOD FOR FORMING CAPACITOR OF SEMICONDUCTOR DEVICE

(75) Inventors: Kyong Min Kim, Kyoungki-do (KR); Han Sang Song, Seoul (KR)

(73) Assignee: Hynix Semiconductor Inc., Ich'on (KR)

( * ) Notice: Subject to any disclaimer, the term of this patent is extended or adjusted under 35 U.S.C. 154(b) by 0 days.

(21) Appl. No.: 09/867,660

(22) Filed: May 31, 2001

(65) Prior Publication Data
US 2002/0025646 A1 Feb. 28, 2002

(30) Foreign Application Priority Data
Jun. 1, 2000 (KR) ........................................ 2000-30091

(51) Int. Cl.[7] ............................................... H01L 21/20
(52) U.S. Cl. ......................... 438/396; 438/3; 438/387; 438/393; 438/686; 438/775
(58) Field of Search .......................... 438/3, 387, 396, 438/393, 686, 768, 775–777

(56) References Cited

U.S. PATENT DOCUMENTS 6,218,297 B1 * 4/2001 Marsh ........................ 438/654
6,340,622 B1 * 1/2002 Lee et al. .................... 438/396

* cited by examiner

Primary Examiner—Matthew Smith
Assistant Examiner—V. Yevsikov
(74) Attorney, Agent, or Firm—Finnegan, Henderson, Farabow, Garrett & Dunner, L.L.P.

(57) ABSTRACT

The present invention discloses a method for forming a capacitor of a semiconductor device which can increase a capacitance and prevent a leakage current at the same time. The method includes the steps of providing a semiconductor substrate where a plug polysilicon film and a metal barrier film consisting of Ti/TiN film have been sequentially filled in a contact hole of an interlayer insulation film, forming a cap oxide film on the semiconductor substrate, patterning the cap oxide film to define a capacitor region and to expose the interlayer insulation film and the metal barrier film, forming a nitride film over the whole substrate according to a plasma treatment using $NH_3$ gas, depositing an Ru film for a lower electrode on the nitride film, forming a cylindrical lower electrode, by performing a chemical mechanical polishing process on the Ru film and the nitride film, and removing the cap oxide film, depositing an amorphous TaON film on the lower electrode, crystallizing the amorphous TaON film according to a thermal treatment, and forming a metal film for an upper electrode on the crystallized TaON film.

28 Claims, 4 Drawing Sheets

METHOD FOR FORMING CAPACITOR OF SEMICONDUCTOR DEVICE

CROSS-REFERENCE TO RELATED APPLICATIONS

This application claims priority from Korean Patent Application No. 2000-30091, filed Jun. 1, 2000, the entirety of which is incorporated herein by reference.

BACKGROUND OF THE INVENTION

1. Field of the Invention

The present invention relates to a method for forming a capacitor of a semiconductor device, and in particular to an improved method for forming a capacitor of a semiconductor device which can increase a capacitance and prevent a leakage current at the same time.

2. Description of the Background Art

The capacitance of a capacitor used as a data storage unit in a semiconductor device is dependent upon the area of the electrode, the gap between the electrodes and the dielectric constant of a dielectric film inserted between the electrodes.

However, the semiconductor device has been highly integrated. Accordingly, the capacitor formation region of the semiconductor device has decreased, and thus the area of the electrode of the capacitor has also decreased, thereby reducing the capacitance of the capacitor.

Therefore, in a capacitor having a structure of metal film-dielectric film-metal film (MIM), an Ru film is deposited as a lower electrode, a TaON film having a high dielectric constant is deposited thereon, and a metal film is deposited on the dielectric film, thereby maximizing the capacitance of the TaON film capacitor.

FIGS. 1 and 2 are cross-sectional diagrams illustrating sequential steps of a conventional method for forming a capacitor of a semiconductor device.

As illustrated in FIG. 1, there is provided a semiconductor substrate (not shown) including a MOSFET (not shown). Here, a plug polysilicon film 5 and a metal barrier film 6 consisting of a Ti/TiN film are sequentially stacked on an interlayer insulation film 4 having a contact hole exposing one of the junction regions (not shown).

A cap oxide film 7 is deposited over the resultant structure in order to form a cylindrical capacitor.

Thereafter, the cap oxide film 7 is patterned to define a capacitor region and to expose the interlayer insulation film and the metal barrier film.

An Ru film 8 for a lower electrode is deposited over the patterned cap oxide film 7a. Here, the Ru film 8 is deposited as the lower electrode according to a general chemical vapor deposition (CVD).

As depicted in FIG. 2, a chemical mechanical polishing (CMP) process is carried out on the Ru film 8 for the lower electrode in order to expose the cap oxide film 7a. A cylindrical Ru film 8a is formed as the lower electrode, by removing the cap oxide film 7a. A TaON film 9 having a high dielectric constant is formed on the cylindrical Ru film 8a, and an upper electrode 10 is formed on the TaON film 9, thereby forming the capacitor of the semiconductor device.

However, the conventional method for forming the capacitor of the semiconductor device has the following disadvantages.

When the metal film is used as the lower electrode, the leakage current property can be improved according to the quality and step coverage of the lower electrode.

However, when the Ru film is deposited according to the CVD, the deposition rate of the Ru film is very slow on the oxide film. Moreover, the Ru film may be heterogeneously deposited according to the substructure, thereby reducing the step coverage and deteriorating the electric property, including a leakage current, of the TaON film capacitor.

SUMMARY OF THE INVENTION

Accordingly, the present invention provides a method for forming a capacitor of a semiconductor device which can improve an electric property, including a leakage current, of the capacitor by enhancing a step coverage of a lower electrode.

The present invention thus provides a method for forming a capacitor of a semiconductor device, including the steps of providing a semiconductor substrate where a plug polysilicon film and a metal barrier film consisting of Ti/TiN film have been sequentially filled in a contact hole of an interlayer insulation film; forming a cap oxide film on the semiconductor substrate; patterning the cap oxide film to define a capacitor region and to expose the interlayer insulation film and the metal barrier film; forming a nitride film over the whole substrate according to a plasma treatment using $NH_3$ gas; forming an Ru film for a lower electrode on the nitride film; forming a cylindrical lower electrode, by performing a chemical mechanical polishing process on the Ru film and the nitride film, and removing the cap oxide film; forming an amorphous TaON film on the lower electrode; crystallizing the amorphous TaON film according to a thermal treatment; and forming a metal film for an upper electrode on the crystallized TaON film.

In addition, there is provided a method for forming capacitor of a semiconductor device, including the steps of providing a semiconductor substrate where a plug polysilicon film and a metal barrier film consisting of Ti/TiN film have been sequentially filled in a contact hole of an interlayer insulation film; forming a cap oxide film on the semiconductor substrate; patterning the cap oxide film to define a capacitor region and to expose the interlayer insulation film and the metal barrier film; forming a nitride film over the whole substrate according to a plasma treatment; forming an Ru film for a lower electrode on the nitride film; forming a lower electrode, by performing a chemical mechanical polishing process on the Ru film and the nitride film, and removing the cap oxide film; forming an amorphous TaON film on the lower electrode; crystallizing the amorphous TaON film according to an rapid thermal process (RTP); and forming a metal film for an upper electrode on the crystallized TaON film.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for forming a capacitor of a semiconductor device in accordance with the present invention will now be described in detail with reference to the accompanying drawings.

FIGS. 3, 4, 5, 6, and 7 are cross-sectional diagrams illustrating sequential steps of a method for forming a capacitor of the semiconductor device in accordance with the present invention.

Figure 1:
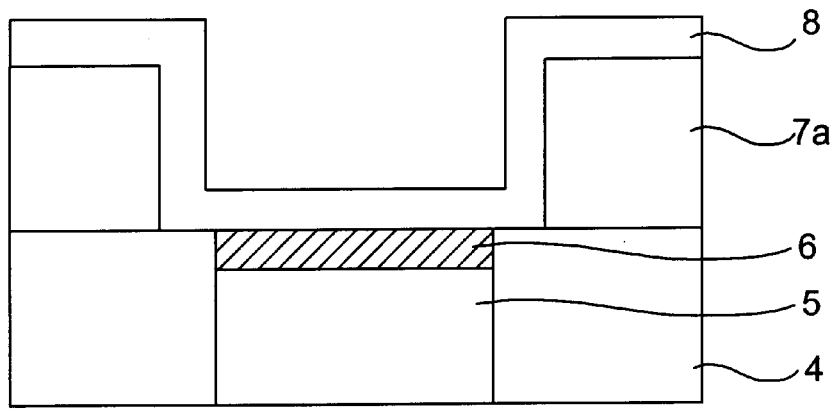
FIGS. 1 and 2 are cross-sectional diagrams illustrating sequential steps of a conventional method for forming a capacitor of a semiconductor device.
Figure 2:
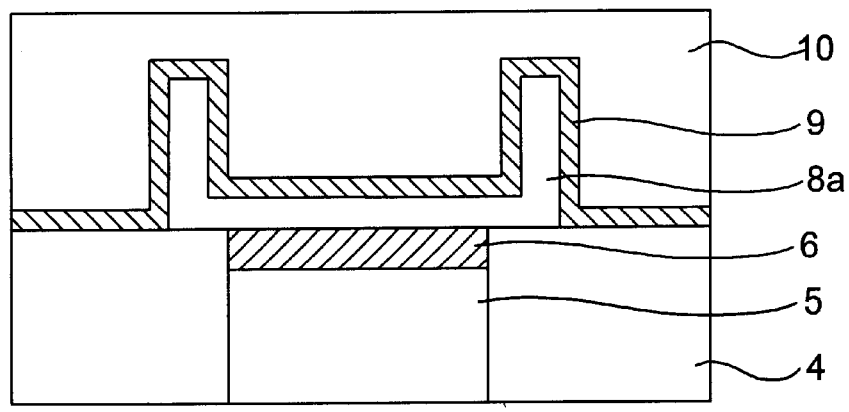
Figure 3:
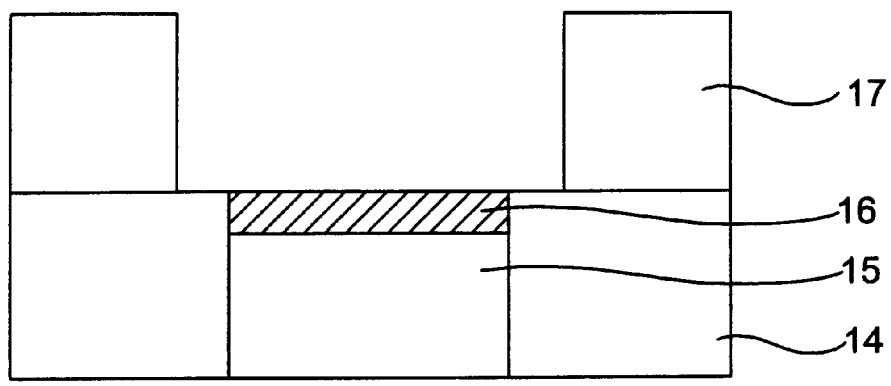
FIGS. 3, 4, 5, 6, and 7 are cross-sectional diagrams illustrating sequential steps of a method for forming a capacitor of a semiconductor device in accordance with the present invention.

As illustrated in FIG. 3, an interlayer insulation film 14 having a contact hole (not shown) exposing one of the junction regions is formed on a semiconductor substrate (not shown) having a MOSFET (not shown).

A polysilicon film is deposited on the contact hole of the interlayer insulation film 14. A chemical mechanical polishing (CMP) process is performed on the polysilicon film to expose the interlayer insulation film 14, thereby forming a plug polysilicon film 15.

The surface of the plug polysilicon film 15 is etched according to an etch back process using an HF solution or a buffer oxide etching agent, thereby removing a natural oxide film. A metal barrier film 16 consisting of a Ti/TiN film is deposited on the etched polysilicon film 15.

Thereafter, the CMP or etch back process is performed on the metal barrier film 16 to expose the interlayer insulation film 14.

In order to form a cylindrical capacitor, a cap oxide film 17 is deposited over the resultant structure.

The cap oxide film 17 is patterned to define a cylindrical capacitor region and to expose the interlayer insulation film 14 and the metal barrier film 16.

Figure 4:
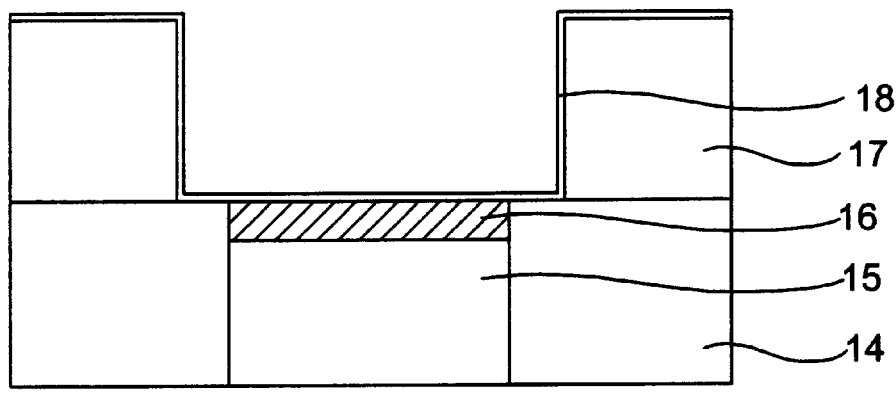

As depicted in FIG. 4, in the case where a metal film is used as a lower electrode, in order to improve a leakage current property according to quality and step coverage of the lower electrode, a homogeneous nitride film 18 is formed on the whole substrate, by exciting plasma by $NH_3$ gas, before depositing the lower electrode.

At this time, the flow rate of the $NH_3$ gas ranges from a few sccm to a few hundreds sccm, the RF power ranges from a few W to a few hundreds W, the pressure ranges from 0.1 Torr to 2 Torr, and the processing time ranges from a few seconds to a few hundreds seconds.

Figure 5:
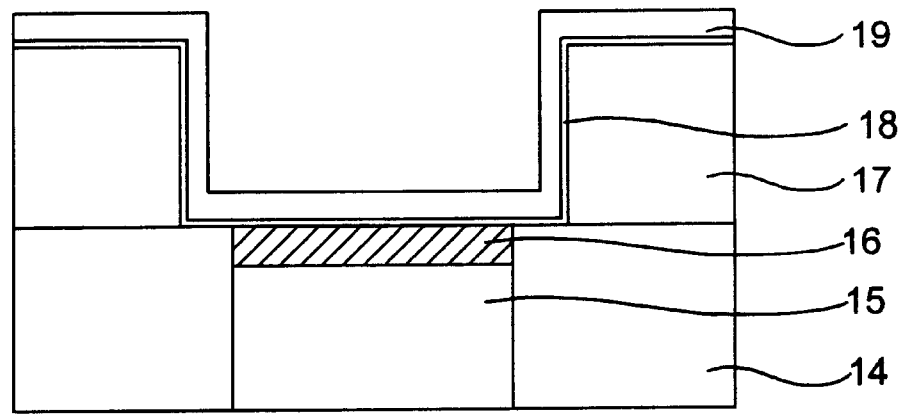

Referring to FIG. 5, an Ru film 19 for a lower electrode is deposited on the nitride film 18. Here, the Ru film 19 is formed by forming tris 2,4-octanedionato Ru in a vapor state, and maintaining a temperature of the semiconductor substrate at 200 to 350° C., a flow rate of $O_2$ reaction gas in a few tens to a few hundreds standard cubic centimeters per minute (sccm), and a pressure of a reactor at a few mTorr to a few Torr.

Figure 6:
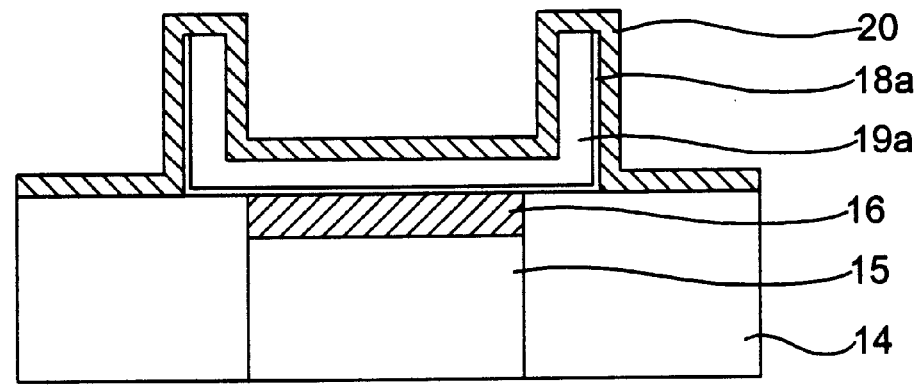

As shown in FIG. 6, the CMP process is performed on the Ru film 19 and the nitride film 18 to expose the cap oxide film 17. Thereafter, the cap oxide film 17 is removed, thereby forming a cylindrical Ru film 19a as the lower electrode.

An amorphous TaON film 20 having a high dielectric constant is formed on the cylindrical Ru film 19a.

Here, the amorphous TaON film 20 is formed according to the chemical vapor deposition, for example the LPCVD. That is, $Ta(C_2H_5O)_5$ is formed in a vapor state in a vaporizer having a temperature of 170 to 190° C., and $NH_3$ having a flow rate of 10 to 1000 sccm is reacted with chemical Ta vapor in an LPCVD chamber maintaining a pressure of 0.1 to 1.2 Torr, a temperature of 300 to 400° C., and receiving $NH_3$ gas, thereby forming the amorphous TaON Thereafter, $N_2O$ plasma or $UV/O_3$ treatment is carried out at 300 to 500° C. by considering an electric property, including a leakage current, of the capacitor.

Figure 7:
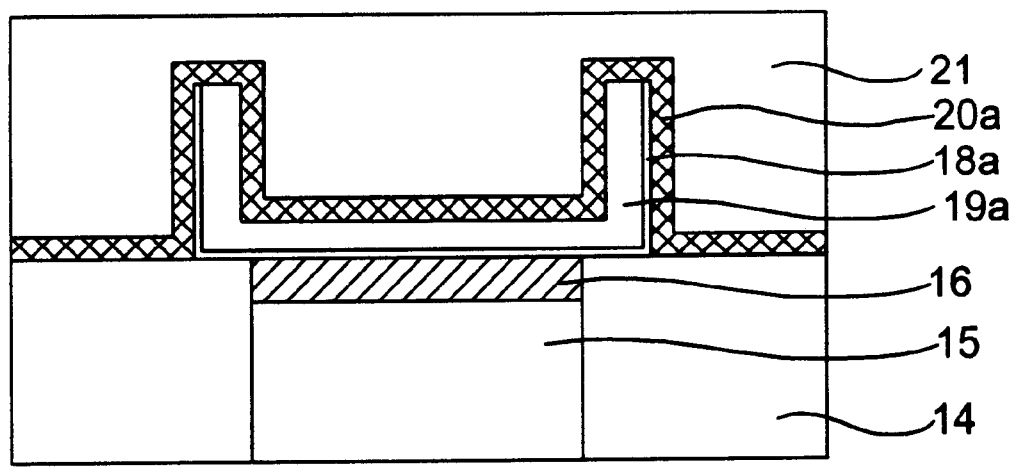

As illustrated in FIG. 7, an RTP is performed on the amorphous TaON film 20 at 500 to 650° C. by using $N_2$ gas and $O_2$, thereby forming a crystallized TaON film 20a.

Preferably, an Ru film or TiN film is deposited on the crystallized TAON film 20a as an upper electrode 21.

As discussed earlier, in accordance with the present invention, when the metal film is used as the lower electrode, in order to improve the leakage current property according to the quality and step coverage of the lower electrode, the nitride film is homogeneously formed by exciting plasma by $NH_3$ gas, before depositing the Ru film for the lower electrode. Thereafter, the Ru film is deposited on the nitride film.

As a result, the homogeneous nitride film enhances the step coverage of the Ru film for the lower electrode, thereby improving the electric property, including a leakage current, of the TaON film capacitor.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method of forming a capacitor of a semiconductor device, comprising:

providing a semiconductor substrate;

forming a nitride film on the semiconductor substrate, said forming comprising a plasma treatment;

forming an Ru film on the nitride film;

forming an amorphous TaON film on the Ru film;

crystallizing the amorphous TaON film, said crystallizing comprising a thermal treatment; and forming an upper electrode on the crystallized TaON film;

wherein forming the nitride film comprises maintaining $NH_3$ gas at a flow rate ranging from 2 sccm to less than 1,000 sccm, an RF power ranging from 2 W to less than 1,000 W, a pressure ranging from 0.1 Torr to 2 Torr, and a processing time ranging from 2 seconds to less than 1,000 seconds.

2. The method according to claim 1, wherein forming the amorphous TaON film comprises using low pressure chemical vapor deposition (LPCVD), comprising forming a vapor comprising Ta, said forming comprising vaporizing $Ta(C_2H_5O)_5$ in a vaporizer having a temperature ranging from 170 to 190° C.; and reacting $NH_3$ gas at a flow rate ranging from 10 to 1000 sccm with the vapor comprising Ta in an LPCVD chamber maintained at a pressure ranging from 0.1 to 1.2 Torr, and a temperature ranging from 300 to 400° C.

3. The method according to claim 1, further comprising performing prior to said crystallizing at least one of $N_2O$ plasma and $UV/O_3$ treatment at a temperature ranging from 300 to 500° C.

4. The method according to claim 1, wherein the upper electrode comprises at least one of an Ru film and a TIN film.

5. The method according to claim 1, further comprising forming a cap oxide film on said semiconductor substrate prior to said forming a nitride film.

6. The method according to claim 1, wherein said Ru film is a cylindrical shape.

7. A method of forming a capacitor of a semiconductor device, comprising:

providing a semiconductor substrate;
forming a nitride film on the semiconductor substrate, said forming comprising a plasma treatment;
forming an Ru film on the nitride film;
forming an amorphous TaON film on the Ru film;
crystallizing the amorphous TaON film, said crystallizing comprising a thermal treatment; and
forming an upper electrode on the crystallized TaON film;
wherein forming the Ru film comprises forming tris 2,4-octanedionato Ru in a vapor state; and maintaining the semiconductor substrate at a temperature ranging from 200 to 350° C., an $O_2$ reaction gas flow rate ranging from 20 to less than 1,000 sccm, and a reactor pressure ranging from 2 mTorr to less than 1,000 Torr.

8. The method according to claim 7, wherein forming the amorphous TaON film comprises using low pressure chemical vapor deposition (LPCVD), comprising forming a vapor comprising Ta, said forming comprising vaporizing $Ta(C_2H_5O)_5$ in a vaporizer having a temperature ranging from 170 to 190° C.; and reacting $NH_3$ gas at a flow rate ranging from 10 to 1000 sccm with the vapor comprising Ta in an LPCVD chamber maintained at a pressure ranging from 0.1 to 1.2 Torr, and a temperature ranging from 300 to 400° C.

9. The method according to claim 7, further comprising performing prior to said crystallizing at least one of $N_2O$ plasma and $UV/O_3$ treatment at a temperature ranging from 300 to 500° C.

10. The method according to claim 7, wherein the upper electrode comprises at least one of an Ru film and a TiN film.

11. The method according to claim 7, further comprising forming a cap oxide film on said semiconductor substrate prior to said forming a nitride film.

12. The method according to claim 7, wherein said Ru film is a cylindrical shape.

13. A method of forming a capacitor of a semiconductor device, comprising:
providing a semiconductor substrate;
forming a nitride film on the semiconductor substrate, said forming comprising a plasma treatment;
forming an Ru film on the nitride film;
forming an amorphous TaON film on the Ru film;
crystallizing the amorphous TaON film, said crystallizing comprising a thermal treatment; and
forming an upper electrode on the crystallized TaON film;
wherein said crystallizing comprises a rapid thermal process (RTP) performed at a temperature ranging from 500 to 650° C. using at least one of $N_2$ and $O_2$ gases.

14. The method according to claim 13, wherein forming the amorphous TaON film comprises using low pressure chemical vapor deposition (LPCVD), comprising forming a vapor comprising Ta, said forming comprising vaporizing $Ta(C_2H_5O)_5$ in a vaporizer having a temperature ranging from 170 to 190° C.; and reacting $NH_3$ gas at a flow rate ranging from 10 to 1000 sccm with the vapor comprising Ta in an LPCVD chamber maintained at a pressure ranging from 0.1 to 1.2 Torr, and a temperature ranging from 300 to 400° C.

15. The method according to claim 13, further comprising performing prior to said crystallizing at least one of $N_2O$ plasma and $UV/O_3$ treatment at a temperature ranging from 300 to 500° C.

16. The method according to claim 13, wherein the upper electrode comprises at least one of an Ru film and a TiN film.

17. The method according to claim 13, further comprising forming a cap oxide film on said semiconductor substrate prior to said forming a nitride film.

18. The method according to claim 13, wherein said Ru film is a cylindrical shape.

19. A method of forming a capacitor of a semiconductor device, comprising:
providing a semiconductor substrate comprising as sequential layers filled in a contact hole of an interlayer insulating film a plug shaped polysilicon film;
forming a sacrificial insulating film on the semiconductor substrate;
patterning the sacrificial insulating film to define a capacitor region and to expose the interlayer insulation film;
forming a nitride film over the whole substrate, said forming comprising a plasma treatment;
forming an Ru film for a lower electrode on the nitride film;
forming a lower electrode, said forming comprising performing a chemical mechanical polishing process on the Ru and the nitride films, and removing the sacrificial insulating film;
forming an amorphous TaON film on the lower electrode;
crystallizing the amorphous TaON film, said crystallizing comprising a rapid thermal process (RTP); and
forming an upper electrode on the crystallized TAON film, said upper electrode comprising at least one of Ru and TiN films.

20. The method according to claim 19, wherein forming the nitride film comprises maintaining a $NH_3$ gas flow rate ranging from 2 to less than 1,000 sccm, an RF power ranging from 2 W to less than 1,000 W, a pressure ranging from 0.1 Torr to 2 Torr, and a processing time ranging from 2 seconds to less than 1,000 seconds.

21. The method according to claim 19, wherein the Ru film for the lower electrode comprises forming tris 2,4-octanedionato Ru in a vapor state; and maintaining the semiconductor substrate at a temperature ranging from 200 to 350° C., an $O_2$ reaction gas flow rate ranging from 20 to less than 1,000 sccm, and a reactor pressure ranging from 2 mtorr to 2 Torr.

22. The method according to claim 19, wherein forming the amorphous TAON film comprises using low pressure chemical vapor deposition (LPCVD), comprising forming a vapor comprising Ta by vaporizing $Ta(C_2H_5O)_5$ in a vaporizer having a temperature ranging from 170 to 190° C.; and reacting $NH_3$ gas at a flow rate ranging from 10 to 1,000 sccm with the vapor comprising Ta in an LPCVD chamber maintained at a pressure ranging from 0.1 to 1.2 Torr, and a temperature ranging from 300 to 400° C.

23. The method according to claim 19, further comprising performing prior to said crystallizing at least one of $N_2O$ plasma and $UV/O_3$ treatment at a temperature ranging from 300 to 500° C.

24. The method according to claim 19, wherein said crystallizing comprises an RTP performed at a temperature ranging from 500 to 650° C. using $N_2$ gas and $O_2$.

25. The method according to claim 19, wherein said sacrificial insulating film comprises a cap oxide film.

26. The method according to claim 19, further comprising forming a metal barrier film prior to said forming a sacrificial insulating film.

27. The method according to claim 26, wherein said metal barrier film comprises Ti and TiN films.

28. A method of forming a capacitor of a semiconductor device, comprising:

providing a semiconductor substrate, comprising as sequential layers filled in a contact hole of an interlayer insulating film, a plug shaped polysilicon film and a metal barrier film, said metal barrier film comprising Ti and TiN films;

forming a cap oxide film on the semiconductor substrate;

patterning the cap oxide film to define a capacitor region and to expose the interlayer insulating film and the metal barrier film;

forming a nitride film over the whole substrate, said forming comprising a plasma treatment;

forming an Ru film for a lower electrode on the nitride film;

forming a lower electrode of cylindrical shape, said forming comprising performing a chemical mechanical polishing process on the Ru and the nitride film, and removing the cap oxide film;

forming an amorphous TaON film;

crystallizing the amorphous TaON film, said crystallizing comprising a rapid thermal process; and forming an upper electrode on the crystallized TaON film, said upper electrode comprising at least one of Ru and TiN films.

* * * * *

UNITED STATES PATENT AND TRADEMARK OFFICE
CERTIFICATE OF CORRECTION

PATENT NO. : 6,607,963 B2
DATED : August 19, 2003
INVENTOR(S) : Kyong Min Kim et al.

It is certified that error appears in the above-identified patent and that said Letters Patent is hereby corrected as shown below:

Column 4,
Line 59, "TIN" should read -- TiN --.

Column 5,
Line 31, "TIN" should read -- TiN --.

Column 6,
Line 27, "TAON" should read -- TaON --.
Line 36, "wherein the" should read -- wherein forming the --.
Line 42, "mtorr" should read -- mTorr --.
Line 44, "TAON" should read -- TaON --.
Line 65, "TIN" should read -- TiN --.

Signed and Sealed this

Ninth Day of March, 2004

JON W. DUDAS
*Acting Director of the United States Patent and Trademark Office*